(12) United States Patent
Musson

(10) Patent No.: US 7,908,317 B2
(45) Date of Patent: Mar. 15, 2011

(54) SYSTEM AND METHOD FOR URL COMPRESSION

(75) Inventor: Scott Allan Musson, Arvada, CO (US)

(73) Assignee: Oracle International Corporation, Redwood Shores, CA (US)

(*) Notice: Subject to any disclaimer, the term of this patent is extended or adjusted under 35 U.S.C. 154(b) by 144 days.

(21) Appl. No.: 12/130,065

(22) Filed: May 30, 2008

(65) Prior Publication Data

US 2008/0307044 A1    Dec. 11, 2008

Related U.S. Application Data

(60) Provisional application No. 60/942,637, filed on Jun. 7, 2007.

(51) Int. Cl.
*G06F 15/16* (2006.01)
(52) U.S. Cl. ........ 709/203; 709/247; 709/217; 709/219; 707/100

(58) Field of Classification Search .................. 709/247, 709/217, 219, 203; 717/100
See application file for complete search history.

(56) References Cited

U.S. PATENT DOCUMENTS

| | | | |
|---|---|---|---|
| 6,598,051 B1 * | 7/2003 | Wiener et al. | 1/1 |
| 7,296,051 B1 * | 11/2007 | Kasriel | 709/203 |
| 7,499,983 B2 * | 3/2009 | Acree et al. | 709/219 |
| 2005/0262032 A1 * | 11/2005 | Smith | 706/47 |
| 2006/0010125 A1 * | 1/2006 | Beartusk et al. | 707/4 |

* cited by examiner

*Primary Examiner* — Kyung-Hye Shin
(74) *Attorney, Agent, or Firm* — Fliesler Meyer LLP

(57) ABSTRACT

A computer-implemented method can be used to support Uniform Resource Locator (URL) compression. Such a method can comprises the steps of receiving a Web request associated with an original URL from a client by a Web component; saving the original URL in a database; generating a compression key in a compressed URL; getting the original URL from the database using the compression key; and responding to the client.

21 Claims, 3 Drawing Sheets http://www.mapuuest.com/mapsJmap,a.dp?ovi=1&mgmaD
p.x=300&mg map.y=75&mapdata=%252bKZmeilh6N%252b1
gpXRP3byIMaNQ04z8000kZWYe7NRH6IdDN96YFTIUmSH3Q6
OzE5XVgcuc5zb%252fY5wyIMZwTnT2pu%252bNMjOjsHjvN
lygTRMzgazPStrN%252f1YzAOoWEWLwkHdhVHeG9sG6cMrf
XNJKHY6fML4o6NbOSeQm75ET9jAjKeIrmgBCNta%252bsKC
9n8jsIz%252fo188N4g3BvAJYuzx8J8r%252f1fPFW_kPYg%
252bT9Su5KoQ9YpNSj%252bmoOhOaEK%252bofj3f6vCP an example of original URL
201

Figure 2A http://tinyurl.com/6z3 an example of compressed URL
202

Figure 2B

SYSTEM AND METHOD FOR URL COMPRESSION

CLAIM OF PRIORITY

This application claims priority from the following application, which is hereby incorporated by reference in its entirety:

U.S. Provisional Application No. 60/942,637, entitled SYSTEM AND METHOD FOR URL COMPRESSION, by Scott Musson, filed on Jun. 7, 2007.

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

FIELD OF THE INVENTION

This invention relates to the field of using URL compression for Portal services.

BACKGROUND

Uniform Resource Locator (URL) is the unique address for a file that is accessible on the Internet.

Portal services such as BEA WebLogic Portal can provide a convenient, extensible mechanism for creating URLs to portal resources in a portal web project that can transfer from domain to domain without breaking, especially when server names and port numbers change. This URL-creation mechanism can also let the user to switch between secure and non-secure URLs.

BRIEF DESCRIPTION OF THE DRAWINGS

FIG. 2A is an exemplary illustration of an original URL before URL compression in accordance with one embodiment of the invention.

FIG. 2B is an exemplary illustration of a compressed URL with compression key after URL compression in accordance with one embodiment of the invention.

DETAILED DESCRIPTION

Figure 1:
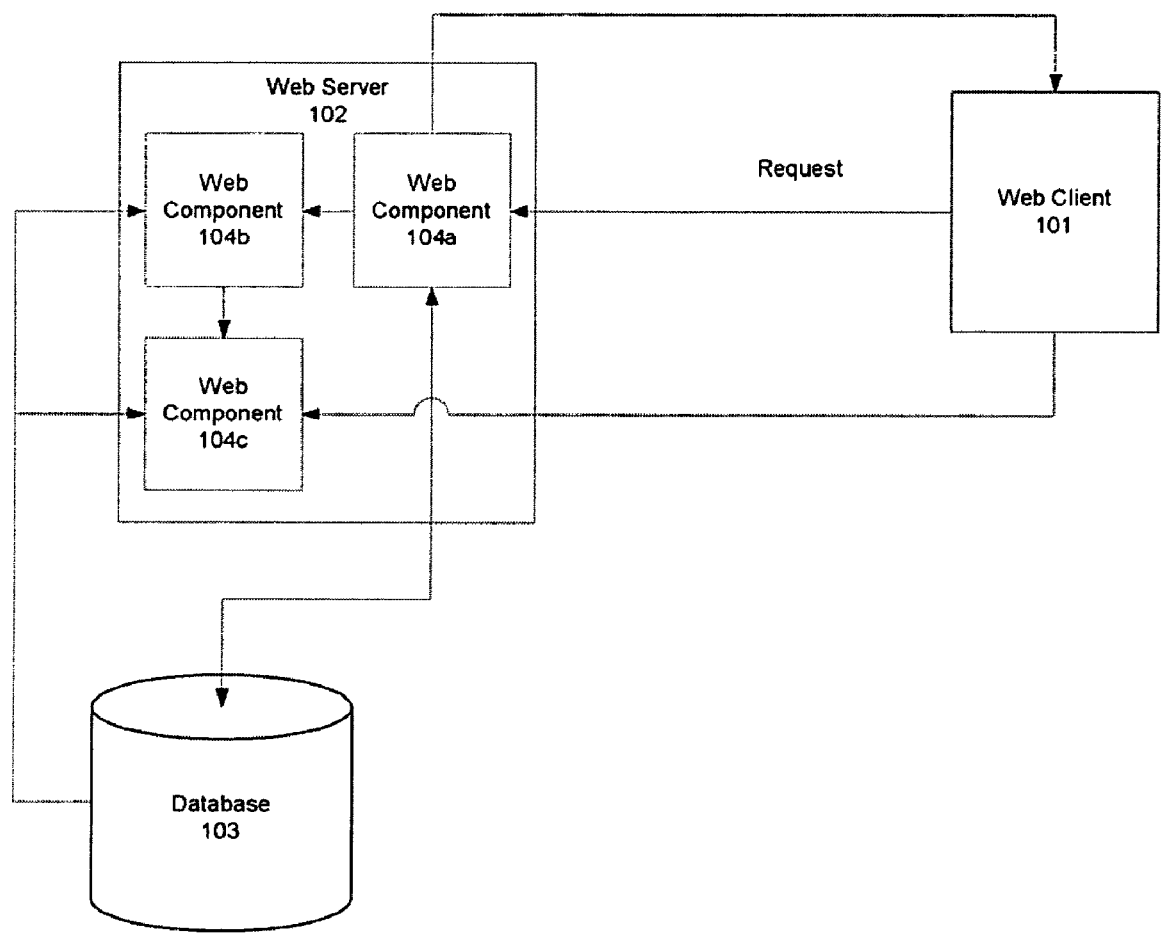
FIG. 1 is an illustration of an exemplary framework of Portal service with URL compression in accordance with one embodiment of the present invention.
Figure 3:
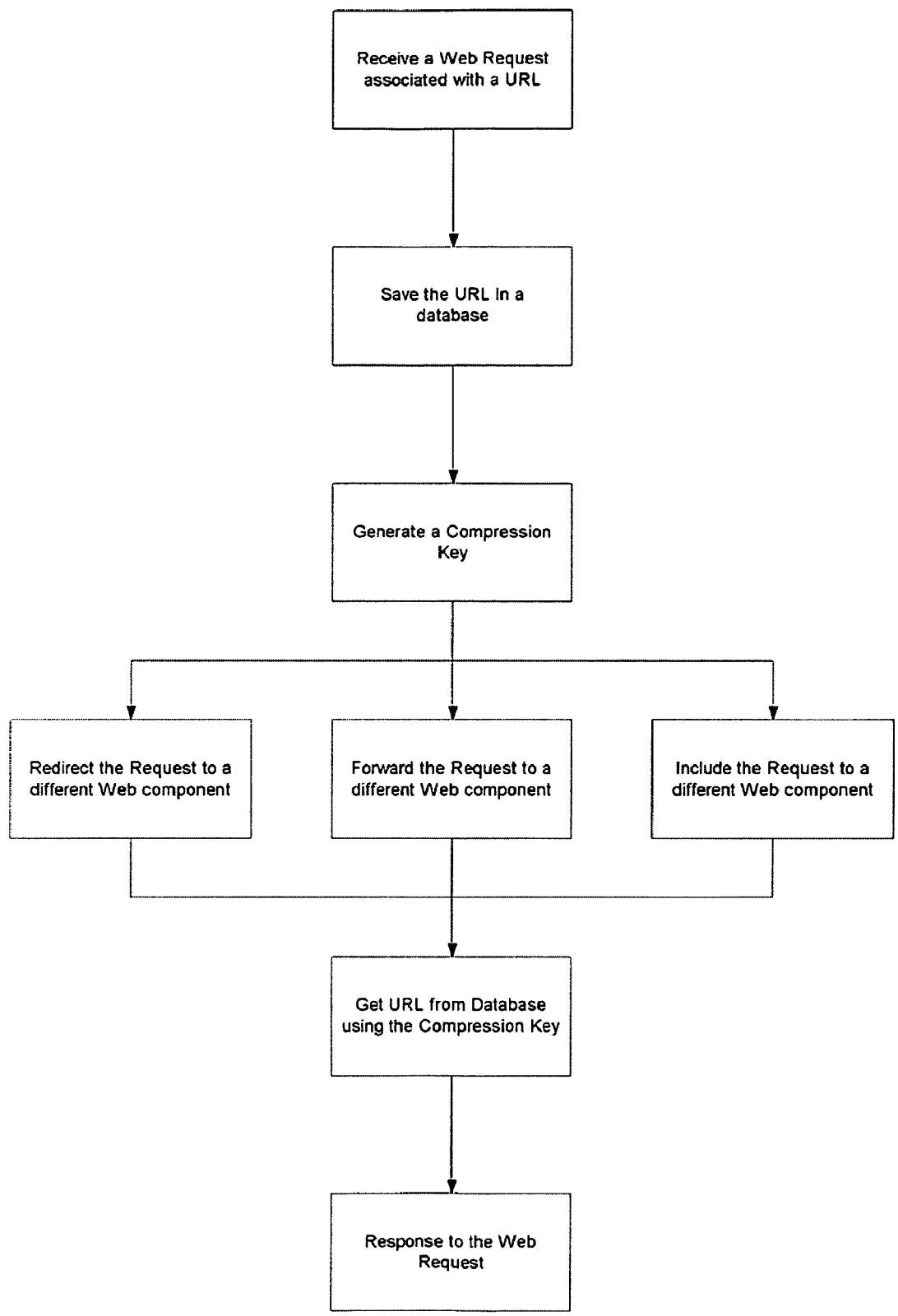
FIG. 3 is a flow chart illustrating an exemplary process of URL compression for Portal service in accordance with one embodiment of the invention.

The invention is illustrated by way of example and not by way of limitation in the figures of the accompanying drawings in which like references indicate similar elements. It should be noted that references to "an" or "one" or "some" embodiment(s) in this disclosure are not necessarily to the same embodiment, and such references mean at least one.

The description of the invention as following uses a Hypertext Transfer Protocol (HTTP) request as an example for a Web request. It will be apparent to those skilled in the art that other types of Web request can be used without limitation.

In one embodiment, portable URLs can be created for a portal service. For example, the two pieces involved in creating portable URLs for BEA WebLogic Portal are:

The <render:*Url> JSP tags in the Portal Rendering JSP tag library.

A portal web project's WEB-INF/beehive-url-template-config.xml file.

The beehive-url-template-config.xml file can contain multiple URL templates, each with a unique name. Those URL templates can contain variables such as url:domain and url:port that are read in from the active server. The <render:*Url> JSP tags can have a template attribute in which one can specify the name of a URL template in beehive-url-template-config.xml.

The following is a sample URL template in beehive-url-template-config.xml.

```
<url-template name="secure-url">
https://{url:domain}:{url:securePort}/{url:path}?{url:queryString}
</url-template>
```

The following explains how the <render:resourceUrl> JSP tag can create a URL using the template.

```
<% String reportpath = "reports/report1.html"; %>
<a href="<render:resourceUrl template="secure-url"
path="<%=reportpath%>"/>">
View the Report
</a>
```

The following are sample variables that can be available for use in URL template building for BEA WebLogic Portal:

{url:domain}—Reads the name of the server from the current request.

{url:port}—Reads the listen port number of the server from the current request. (See Troubleshooting below.)

{url:securePort}—Reads the SSL port number of the server from the current request. (See Troubleshooting below.)

{url:path}—Reads the name of the web application. The URLs to all resources in a web application are relative to the web application directory.

{url:queryString}—Reads a queryString variable for the URL.

{url:compression}—Allows one to use the pluggable compression mechanism to create shorter, more readable, URLs.

One embodiment of the present invention is a computer-implemented method to support Uniform Resource Locator (URL) compression, which can comprise steps of: receiving from a client 101 by a Web component 104a a Web request, such as a HTTP request associated with an original URL; saving the original URL in a database 103; generating a compression key in a compressed URL; getting the original URL from the database 103 using the compression key; and responding to the client 101.

In one embodiment of the present invention, the computer-implemented method can further comprise one of the following: forwarding the Web request from one Web component 104a to a different Web component 104b or 104c; redirecting the Web request from one Web component 104a to a different Web component 104b or 104c; or including the Web request from one Web component 104a in to a different Web component 104b or 104c.

In one embodiment of the present invention, the compression key can be a hex string generated from a database sequencer, such as a P13N database sequencer.

In one embodiment of the present invention, the compressed URL can be bookmarkable by the client. In addition, the compressed URL can survive system restarts and failover correctly in a cluster.

In one embodiment of the present invention, the computer-implemented method can further comprise routing to an error page on a RuntimeException. In another embodiment of the present invention, the computer-implemented method can further comprise enabling compression on a template by template basis within an XML configuration file.

One embodiment of the present invention is a computer-implemented system to support Uniform Resource Locator (URL) compression, which can comprise a Web Client 101 that is capable of sending a Web request associated with an original URL to a Web Server 102; a Web component 104*a* residing on the Web Server 102; and a Database 103. The Database 103 is capable of saving the original URL; generating a compression key in a compressed URL; and providing the original URL based on the compression key.

In one embodiment of the present invention, the Web component residing on the Web Server operate to forward, redirect or include the Web request with the compressed URL from one Web component 104*a* to a different Web component 104*b* or 104*c*, wherein the another Web component 104*b* or 104*c* operate to use the compression key within the compressed URL to get the original URL. In another embodiment of the present invention, a Web component can reside on a different Web Server.

In one embodiment of the present invention, the computer-implemented system can further comprise an XML configuration file that enables compression on a template by template basis.

In one embodiment of the present invention, lossless data compression, such as the Huffman algorithm can be used. While lossless data compression can provide thirty to fifty percent compression on most URLs, the outcome is in binary format. In addition, after encoding the compressed bytes with Base64, the ensuing URL can be as long as the original URL.

In one embodiment of the present invention, a service such as TinyURL can compress URLs and assign them to a small URL. One example is shown in FIG. 2. As shown in FIG. 2, a fully qualified URL 201 can be turned it into a hex number key in TinyURL, a compressed URL 202. When the TinyURL is hit, it can look up the fully qualified URL from the key and redirects to the fully qualified URL. For example, a simple prototype using in-memory hashes for the real URL against a simplified URL represented as a hex number, can generate on average greater than 50% URL compression.

In one embodiment of the present invention, a utility tool such as GenericURL can be implemented to direct all URL generation, e.g. PageURL. For example, after looking at the design and implementation of the URL classes, all of the derived URL classes can delegate to GenericURL.toString( ) method. So that replacement of the real URL with the compressed version URL can happen in this method.

In one embodiment of the present invention, the compressedUrl key can be a hex string generated from a P13N database sequencer. The following is a sample URL compression.
  original: /gaPortal/framework/skins/default/images/title-bar-button-minimize.gif
  compressed: /gaPortal/wlp.c? c=12

In one embodiment of the present invention, there can be a public accessible Abstract Programming Interface (API) for URL compression.
  public String getCompressedUrlFor(String expandedUrl)
  public String getExpandedUrlFor(String compressedUrl)
In one embodiment of the present invention, the compressed lookup can be based on a hash or compression Key, plus real URL. The expanded URL lookup can be a sequence number plus compressed URL.

For example, there can be a Table PF URL COMPRESSION, which contains

---

Columns:
  URL_COMPRESSION_ID which is an INTEGER,
  EXPANDED_URL_HASH which is also an INTEGER,
  EXPANDED_URL VARCHAR(1000),
  PAGE_LABEL VARCHAR(80).
Sequencer: COMPRESSION_URL_ID;
Primary key: URL_ COMPRESSION ID
Indices:
  URL COMPRESSION_ID,
  EXPANDED_URL_HASH,
  PAGE_LABEL

---

Expanded URL can be looked up by the ID (compressed URL) directly. ID can be looked up by the HASHED_EXPANDED_URL. In the case when hashes are not guaranteed to be unique, a secondary search can be performed on the EXPANDED_URL, e.g. select URL COMPRESSION-ID from PF_URL_COMPRESSION where EXPANDED_URL_HASH=? and EXPANDED URL=?.

In one embodiment of the present invention, a web component such as a servlet can have the ability of routing a HTTP request to an error page on a RuntimeException. Checked exceptions in the generation framework can be logged as errors and handled gracefully. One example is the ejg Create Exception. Another example is UrlCompressionServlet.URL_COMPRESSION_ERROR, which is an attribute that the error page can access for the exception.

In another embodiment of the present invention, the user can just get the standard server error.

In one embodiment of the present invention, if the servlet is invoked but the resource is not found, it will forward the HTTP request to the DefaultPage. In another embodiment of the present invention, when a default page is not specified, the standard 404 will happen.

In one embodiment of the present invention, examples of Web components are servlet parameters, servlet and JavaServer Pages (JSP) definitions, and Uniform Resource Locators (URL) mappings. The followings are sample web.xml entries that provides configuration and deployment information for the Web components that comprise a Web application.

---

```
<servlet>
    <servlet-name>UrlCompressionServlet</servlet-name>
    <servlet-class>com.bea.portlet.compression.-
    UrlCompressionServlet</servlet-class>
    <init-param>
        <param-name>defaultPage</param-names
        <param-values/home.jsp</param-value>
    </init-param>
    <init-param>
        <param-name>errorPage</param-name>
        <param-value>/errors/error.jsp</param-value>
    </init-param>
    <load-on-startup>1</load-on-startups
</servlet>
```

-continued

```
<servlet-mapping>
    <servlet-name>UrlCompressionServlet</servlet-name>
    <url-pattern>wlp.c</url-patterns>
</servlet-mapping>
```

In one embodiment of the present invention, a Web Component such as a servlet needs to be initialized at startup, not on first request. In this case, if the servlet is not initialized on startup, the tags will not know how to create the correct URLs based on the URL-pattern specified in the servlet-mapping. In one example, when there is only one mapping for the URL compression servlet, if multiples are specified the URL generation classes, tags may behave indeterminately.

In one embodiment of the present invention, to enable compression, one can do it on a template by template basis within a configuration file such as url-template-config.xml. In one example, to enable it for a template, simply add {url:compression}

In some embodiments of the present invention, URL compression will only work if the portal developers have followed best practices and used the URL tags and classes to generate their URLs.

As an example, url-template-config.xml templates that use compression may need to have the {url: scheme}//; {url:domain}

These can either be set through the expansion tags ('url: scheme' and 'url:domain') or statically (e.g. http://localhost)

```
<url-template name="portlet-resource">
    {url:scheme}: // {url:domain}:{url:port}/
    {url:path}?{url:queryString} {url:compression}
</url-template>
```

In one embodiment of the present invention, a control state can be written to a URL. In this case, there can be a lot more entries in the database. The size of cache may need to be increased for the purpose of state rewriting.

The following is an example of web.xml entry that can map to defaultPage

```
<error-page>
    <error-code>404 </error-code>
    <location>/index.jsp</location>
</error-page>
```

The following is an example of web.xml entry that can map to errorPage

```
<error-page>
    <error-code > 500 </error-code >
    <location >/errors/error.jsp </location>
</error-page>
```

In some embodiments of the present invention, forwarding can be more efficient in terms of performance due to less overhead load of exchanging HTTP headers between the Web server and a client. Moreover, while redirect may only cause a GET request to the new location, forward can take care of both GET and POST requests.

In some embodiments of the present invention, the stored secure URLs are authenticated before establishing SSL connection and storing in the database to avoid security concerns. An example is a GET request containing a username and a password for login.

In some embodiments of the present invention, a function such as encodeUrl( ) can be called after URL compression so that the session ID can be retrieved on subsequent requests. In other embodiments, using forward can avoid the issue of storing the session ID.

In some embodiments of the present invention, resource URLs may not be compressed, when users want to deploy resources outside the portal web application. For example, certain tags (render:resourceURL, netui:image, portlet:resourceURL etc) can be generated using resource URL template. Users could deploy images on a proxy, and update the URL template to refer to the proxy server. In this case, URL compression may break image tags.

In some embodiments of the present invention, performance issues associated with the possible large number of URLs stored in the database can be resolved by using measures such as p13n cache to cache database results in memory.

In some embodiments of the present invention, a good chunk of URLs generated can be shared across users. In these cases, a reverse look up can be employed since none of the URLs are user specific until an application adds unique information based on a user to the request.

Some embodiments of the present invention can have portability across web-apps, nodes in the cluster etc.

In some embodiments of the present invention, both absolute URLs and relative URLs can be stored. In some embodiments, URL stored can always point to the proxy. In other embodiments, it can save a few cycles if relative URL is stored since web application-relative URLs may be needed for forwarding at request time.

One embodiment includes a computer program product which is a storage medium (media) having instructions stored thereon/in which can be used to program a computer to perform any of the features present herein. The storage medium can include, but is not limited to, any type of disk including floppy disks, optical discs, DVD, CD-ROMs, micro drive, and magneto-optical disks, ROMs, RAMs, EPROMs, EEPROMs, DRAMs, flash memory of media or device suitable for storing instructions and/or data stored on any one of the computer readable medium (media), the present invention can include software for controlling both the hardware of the general purpose/specialized computer or microprocessor, and for enabling the computer or microprocessor to interact with a human user or other mechanism utilizing the results of the present invention. Such software may include, but is not limited to, device drivers, operating systems, execution environments/containers, and user applications.

Embodiments of the present invention can include providing code for implementing processes of the present invention. The providing can include providing code to a user in any manner. For example, the providing can include transmitting digital signals containing the code to a user; providing the code on a physical media to a user; or any other method of making the code available.

Embodiments of the present invention can include a computer implemented method for transmitting code which can be executed at a computer to perform any of the processes of embodiments of the present invention. The transmitting can include transfer through any portion of a network, such as the Internet; through wires, the atmosphere or space; or any other type of transmission. The transmitting can include initiating a transmission of code; or causing the code to pass into any region or country from another region or country. For example, transmitting includes causing the transfer of code through a portion of a network as a result of previously addressing and sending data including the code to a user. A transmission to a user can include any transmission received by the user in any region or country, regardless of the location from which the transmission is sent.

Embodiments of the present invention can include a signal containing code which can be executed at a computer to perform any of the processes of embodiments of the present invention. The signal can be transmitted through a network, such as the Internet; through wires, the atmosphere or space; or any other type of transmission. The entire signal need not be in transit at the same time. The signal can extend in time over the period of its transfer. The signal is not to be considered as a snapshot of what is currently in transit.

The forgoing description of preferred embodiments of the present invention has been provided for the purposes of illustration and description. It is not intended to be exhaustive or to limit the invention to the precise forms disclosed. Many modifications and variations will be apparent to one of ordinary skill in the relevant arts. For example, steps preformed in the embodiments of the invention disclosed can be performed in alternate orders, certain steps can be omitted, and additional steps can be added. The embodiments where chosen and described in order to best explain the principles of the invention and its practical application, thereby enabling others skilled in the art to understand the invention for various embodiments and with various modifications that are suited to the particular used contemplated. It is intended that the scope of the invention be defined by the claims and their equivalents.

What is claimed is:

1. A computer-implemented method to support Uniform Resource Locator (URL) compression, comprising:
    defining a URL template in a template configuration file for a portal service, wherein the URL template contains one or more variables that defines a portable URL for accessing the portal service;
    receiving a web request from a client by a web component for accessing the portal service, wherein the web request contains one or more values for the one or more variables in the URL template, and wherein the web component uses the URL template to create a URL based on the one or more values contained in the web request, wherein the URL is used to access the portal service;
    allowing the web request to be a HTTP request that uses the portable URL to access the portal service;
    allowing the web component to use a JSP tag to create the URL based on the URL template;
    allowing the web component to use a tag library to support the JSP tag that defines a template attribute to specify the URL template;
    compressing the URL into a compressed URL using a URL compression mechanism associated with the URL template;
    processing the web request using the compressed URL; and
    responding to the client.

2. The method according to claim 1, further comprising at least one of:
    forwarding the compressed URL associated with the web request to a different web component;
    redirecting the compressed URL associated with the web request to a different web component; and
    including the compressed URL associated with the web request in a different web component.

3. The method according to claim 1, wherein:
    the URL compression mechanism generates a compression key in the compressed URL and saves the URL into a database, and the compression key is a hex string.

4. The method according to claim 1, wherein:
    the compressed URL is bookmarkable by the client.

5. The method according to claim 1, wherein:
    the compressed URL is able to survive system restarts.

6. The method according to claim 1, wherein:
    the compressed URL failover correctly in a cluster.

7. The method according to claim 1, further comprising:
    routing to an error page on a RuntimeException.

8. The method according to claim 1, further comprising:
    enabling compression on a template by template basis within an extensible markup language (XML) configuration file.

9. The method according to claim 1, further comprising:
    allowing multiple generated URLs to be shared across users and supporting a reverse look up mechanism.

10. The method according to claim 1, further comprising:
    defining another URL template in the template configuration file and allowing the another URL template to be associated with a different URL compression mechanism.

11. The method according to claim 1, further comprising:
    preventing a resource URL from being compressed, wherein the resource URL are generated from a resource URL template.

12. A computer-implemented system to support Uniform Resource Locator (URL) compression, comprising:
    one or more microprocessors and a memory;
    a web component, running on the one or more microprocessors, wherein the web component includes a URL template that is defined in a template configuration file for a portal service, and wherein the URL template contains one or more variables that defines a portable URL for accessing the portal service,
    wherein the web component is capable of:
        receiving a web request from a client for accessing the portal service, wherein the web request contains one or more values for the one or more variables in the URL template, and wherein the web component uses the URL template to create a URL based on the one or more values contained in the web request, wherein the URL is used to access the portal service;
        allowing the web request to be a HTTP request that uses the portable URL to access the portal service;
        allowing the web component to use a JSP tag to create the URL based on the URL template;
        allowing the web component to use a tag library to support the JSP tag that defines a template attribute to specify the URL template;
        compressing the URL into a compressed URL using a URL compression mechanism associated with the URL template;
        processing the web request using the compressed URL; and
        responding to the client.

13. The system according to claim 12, wherein:
    the web component resides on a web server operate to at least one of
        forward the compressed URL associated with the web request to another web component,
        redirect the compressed URL associated with the web request to another web component, and
        include the compressed URL associated with the web request in another web component.

14. The system according to claim 13, wherein:
the another web component resides on a different web server.

15. The system according to claim 12, wherein:
the URL compression mechanism generates a compression key in the compressed URL and saves the URL into a database, and the compression key is a hex string.

16. The system according to claim 12, wherein:
the compressed URL is bookmarkable by the client.

17. The system according to claim 12, wherein:
the compressed URL is able to survive system restarts.

18. The system according to claim 12, wherein:
the compressed URL failover correctly in a cluster.

19. The system according to claim 12, wherein:
the web component routs the web request to an error page on a RuntimeException.

20. The system according to claim 12, further comprising:
an extensible markup language (XML) configuration file that enables compression on a template by template basis.

21. A non-transitory machine readable storage medium having instructions stored thereon that when executed, cause a system to:

define a URL template in a template configuration file for a portal service, wherein the URL template contains one or more variables that defines a portable URL for accessing the portal service;

receive a web request from a client by a web component for accessing the portal service, wherein the web request contains one or more values for the one or more variables in the URL template, and wherein the web component uses the URL template to create a URL based on the one or more values contained in the web request, wherein the URL is used to access the portal service;

allowing the web request to be a HTTP request that uses the portable URL to access the portal service;

allowing the web component to use a JSP tag to create the URL based on the URL template;

allowing the web component to use a tag library to support the JSP tag that defines a template attribute to specify the URL template;

compress the URL into a compressed URL using a URL compression mechanism associated with the URL template;

process the web request using the compressed URL; and respond to the client.

* * * * *